United States Patent [19]

Bednorz et al.

[11] Patent Number: 4,643,627

[45] Date of Patent: Feb. 17, 1987

[54] VACUUM TRANSFER DEVICE

[75] Inventors: Johannes G. Bednorz, Adliswil; Pierre L. Gueret, Richterswil; Hermann E. Nievergelt, Adliswil; Hanspeter Ott, Thalwil; Wolfgang D. Pohl, Adliswil; Daniel F. Widmer, Hirzel, all of Switzerland

[73] Assignee: International Business Machines Corporation, Armonk, N.Y.

[21] Appl. No.: 782,849

[22] Filed: Oct. 2, 1985

[30] Foreign Application Priority Data

Oct. 16, 1984 [CH] Switzerland .................. 84112378

[51] Int. Cl.⁴ ................. A61K 27/02; H01L 21/68
[52] U.S. Cl. ........................... 414/217; 74/110; 250/561; 414/749; 901/21; 901/27
[58] Field of Search ............... 414/217, 222, 744 A, 414/744 R, 225, 281, 283, 659, 663, 749; 74/110; 901/21, 27; 250/561

[56] References Cited

U.S. PATENT DOCUMENTS 2,817,447 12/1957 Bianca .................. 414/663
3,396,601 8/1968 Wright ................. 74/110 X
3,402,835 9/1968 Salil .................... 414/273
3,439,815 4/1969 Wagner et al. ......... 414/283 X
3,556,329 1/1971 Johnston et al. ....... 414/663
3,977,550 8/1976 Crawford et al. ...... 414/659
4,433,951 2/1984 Koch et al. ........... 414/222 X
4,553,069 11/1985 Purser ................. 414/222 X

FOREIGN PATENT DOCUMENTS 2403866 4/1979 France .

OTHER PUBLICATIONS

IBM Technical Disclosure Bulletin, vol. 17, No. 8, Jan. 1975, pp. 2268-2269, Y. Budo et al., "Modular Vacuum System".
IBM Technical Disclosure Bulletin, vol. 18, No. 2, Jul., 1975, pp. 341-342, J. C. Kenish et al., "Stepping Motor Actuated Chip Handler".

Primary Examiner—Robert J. Spar
Assistant Examiner—Stuart J. Millman
Attorney, Agent, or Firm—Douglas A. Lashmit

[57] ABSTRACT

A vacuum transfer device includes a central processing chamber and a plurality of additional chambers radially positioned around the central chamber and in vacuum-tight connection therewith. A rotatable coulisse arrangement in the central chamber is extendable so as to reach into the additional chambers when correctly aligned. The device can transfer objects among several work stations without intermediate venting and re-evacuation of the system of chambers.

3 Claims, 7 Drawing Figures

VACUUM TRANSFER DEVICE

BACKGROUND OF THE INVENTION

This invention relates to a vacuum transfer device for use in connection with the manufacture or testing of electronic integrated circuit chips and the like under vacuum.

The fabrication and testing of present-day electronic circuitry often requires processing under vacuum, for example, because the processing steps per se must be performed under vacuum, or cleanliness requirements can be met only if enough dust-carrying air or gas has been pumped from the environment. The manufacture of integrated circuits typically involves a plurality of steps of different nature, such as etching, evaporation, sputtering, etc., which for various reasons cannot be performed at a single location. In known processing apparatus, when a device being manufactured or tested is removed from one work station and transferred to the next, the first work station must be vented and the second evacuated. Including the required heating of the system, the transfer process could easily take tens of hours to complete. The yield achievable with these systems is reduced because the repeated venting and evacuating adversely affects certain devices.

Prior art transport systems and handling devices are described, for example, in the IBM Technical Disclosure Bulletin, Vol. 18, No. 11, pp. 3669-3676 and 3679-3080 (April 1976). These and other handling devices either operate under normal ambient conditions or use streams of air as transport means. Also known in the art are linear transfer devices, for use under vacuum conditions, which permit the movement of objects along a linear path, for example, into and out of a processing chamber through an airlock system. None of these devices is capable of serving a plurality of processing chambers belonging to the same vacuum-protected system in a circular arrangement about a central chamber.

SUMMARY OF THE INVENTION

It is, therefore, an object of the present invention to provide a vacuum-compatible transfer device which is capable of moving a circuit chip or similar object among a plurality of processing locations, without requiring the venting and re-evacuating of the system or parts thereof each time the object is moved.

According to one embodiment of the invention, a vacuum transfer device for transferring objects within a protected system of evacuatable chambers includes a central chamber and a plurality of additional chambers radially arranged around the central chamber. The central chamber is provided with a table having a rotor on top which carries a coulisse arrangement for transferring the objects situated thereon to any one of the additional chambers.

BRIEF DESCRIPTION OF THE DRAWINGS

The invention will hereafter be described by way of example and with the aid of the attached drawings in which.

DETAILED DESCRIPTION OF THE INVENTION

Figure 1:
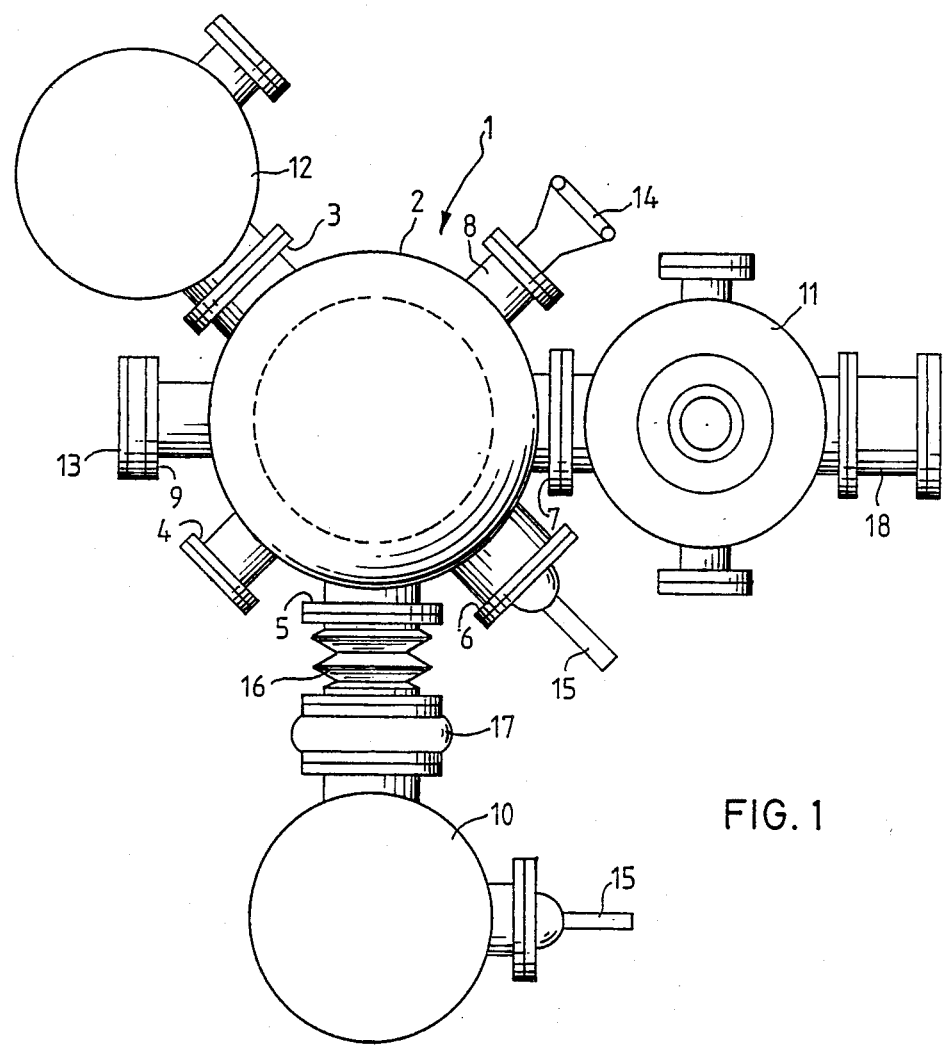
FIG. 1 is a top plan view of an arrangement of processing chambers.

Referring to FIG. 1, a central processing chamber 1 consists of a cylindrical or spherical autoclave 2 having a plurality of flanges 3-9 which permit the vacuum-tight connection of processing chambers, e.g., chambers 10, 11 and 12. Flanges 4, 6, 8 and 9 may be used to connect additional processing chambers or may be equipped with optical inspection means such as window 13 and camera 14, may receive manipulators such as manipulator 15, or may simply be closed like flange 4. The interconnection between central chamber 1 and any additional chamber 10, 11, 12 may be provided with a bellows 16 and a slide valve 17, as shown for chamber 10. Closing the connection to slide valve 17 during processing ensures that no contaminating material can propagate through the bellows 16 to other chambers.

Chamber 11 is an input/output port for the system. It is provided with an airlock 18 through which, for example, a circuit chip can be introduced into the system or removed therefrom.

Figure 2:
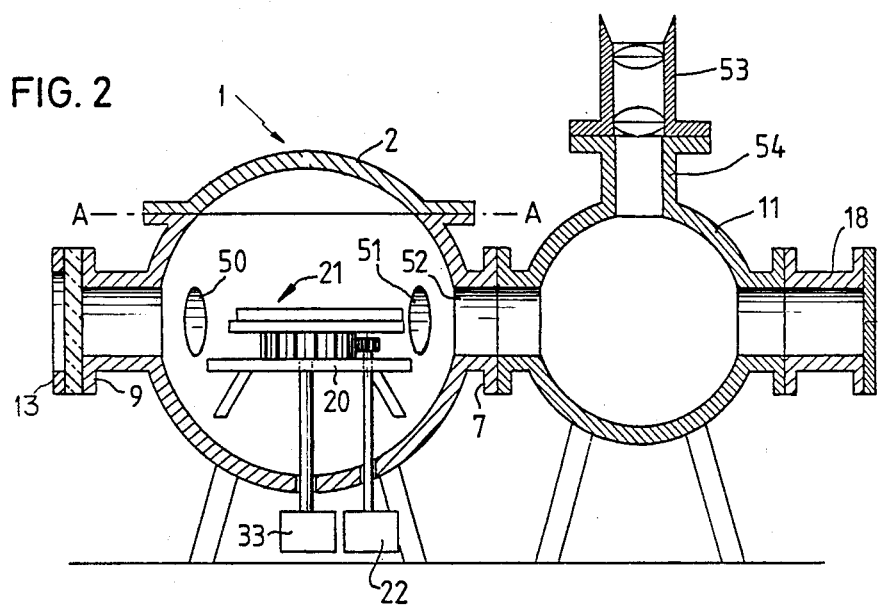
FIG. 2 is a vertical cross-sectional view of the central chamber and an input chamber taken along line 2—2 of FIG. 1, with the coulisse arrangement in home position.

FIG. 2 shows a vertical cross-sectional view through central chamber 1 and chamber 11. Central chamber 1 may be divided along line A—A to permit access to its interior. Inside chamber 1 is mounted a transfer mechanism formed of a table 20, on which is rotatably mounted a coulisse arrangement 21 which can be rotated by a motor 22 so as to be aligned with any one of the ducts (49-52 shown) leading to flanges 3-9.

Figure 3:
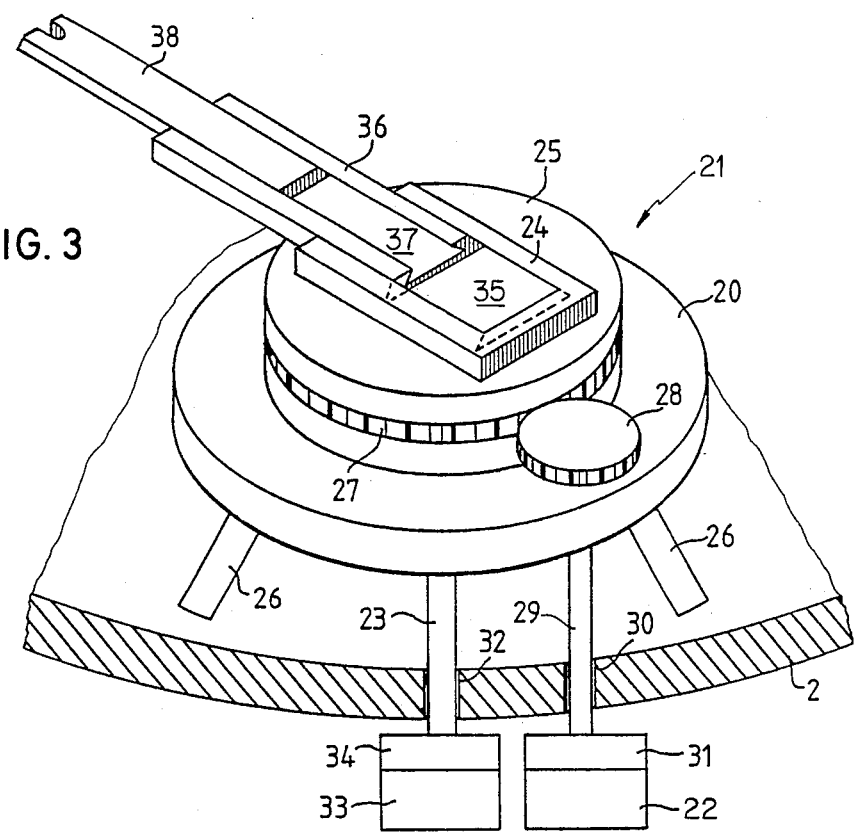
FIG. 3 is a perspective view of the coulisse arrangement and its drive mechanism.

Details of the rotary drive for the coulisse arrangement 21 are shown in FIG. 3. A base plate 24 is attached to a rotor 25 rotatably supported on table 20 which rests on legs 26 on the interior surface of autoclave 2. Rotor 25 is provided with a gear 27 which is in engagement with a pinion 28 on a shaft 29. Leading through a vacuum-tight feedthrough 30, shaft 29 is connected to an angular positioner 31 which is attached to motor 22. Positioner 31 permits the exact alignment of coulisse arrangement 21 with any one of the additional chambers 10-12 as may be required during processing.

Figure 4:
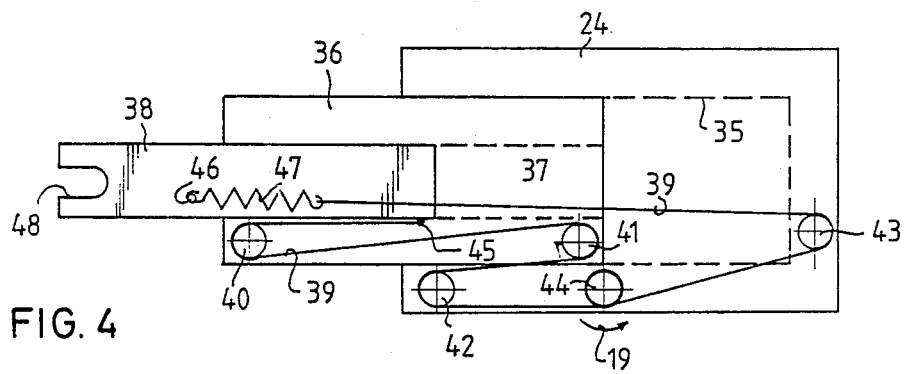
FIG. 4 shows details of the traction mechanism of the coulisse arrangement of FIG. 3.

Leading through a vacuum-tight feedthrough 32 is a shaft 23 which provides linear movement to coulisse arrangement 21 from a motor 33 and an angular positioner 34. To permit coulisse arrangement 21 to rotate through a 360° arc, shaft 23 is arranged concentric with respect to the base plate 24. A simple toothed-wheel gearing (not shown) is provided to transfer the rotation of shaft 23 to an eccentrically located cable driving drum 44, shown in FIG. 4.

Coulisse arrangement 21 is a three-part extendable support (FIG. 4) formed of base plate 24 which receives in a dovetailed groove 35 a first slider 36, which in turn in a dovetailed groove 37 thereof receives a second slider 38. Coulisse arrangement 21 can be extended and retracted by means of a wire traction system including a cable 39, pulleys 40-43, and a cable driving drum 44.

One end of cable 39 is secured at point 45 to the second slider 38 from which it passes around a first pulley 40 rotatably supported on one end of the first slider 36, and around a second pulley 41 mounted on the other end of slider 36. Rotatably supported on one end of base plate 24 is a third pulley 42, and cable 39 coming from pulley 41 passes around pulley 42, then for a full winding around cable drum 44, and around a fourth pulley 43 from which it is returned to a point 46 on second slider 38 where it is fixed.

Cable drum 44 is connected via shaft 23 to the angular positioner 34 of motor 33. As drum 44 is rotated in the direction of arrow 19, the distance between pulleys 41 and 42 as well as between pulley 40 and point 45 is decreased causing sliders 36 and 38 to extend, sliding in grooves 35 and 37, respectively. Rotating cable drum 44 in the direction opposite arrow 19 causes cable 39 to pull point 46 towards pulley 43, thus retracting the sliders 36 and 38 back into base plate 24. To avoid any slack in cable 39, a spring 47 may, for example, be inserted where cable 39 reaches point 46 on the second slider 38. By appropriate design of sliders 36, 38 and suitable placement of pulleys 40-43, coulisse arrangement 21 can be made to move backward beyond its home position, thus obviating the need to rotate coulisse arrangement 21 180° to address a location opposite the previously addressed location.

Figure 5:
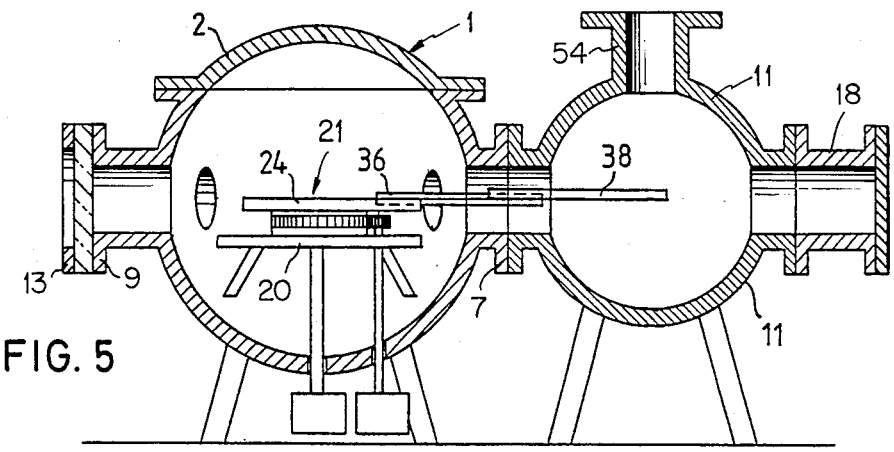
FIG. 5 shows the coulisse arrangement in extended position reaching into another chamber.

Referring again to FIG. 2, coulisse arrangement 21 can be rotated by motor 22 to become aligned with any desired one of the openings 49-52 in autoclave 2, respectively leading to flanges 9, 3, 8 and 7, or to any of the other openings not shown in FIG. 2. When coulisse arrangement 21 is aligned with the selected opening, motor 33 is actuated to extend sliders 36 and 38 through the opening into the annexed processing chamber, for example, chamber 11, as shown in FIG. 5.

The exact position of the extending slider 38 carrying the device being transferred can be monitored and, if necessary, corrected by means of position sensors. The device position can also be observed through a microscope 53 attached to a flange 54 arranged on top of chamber 11 shown, by way of example, in FIG. 2. To aid in the positioning of slider 38, optical position indicators may be provided.

Figure 6:
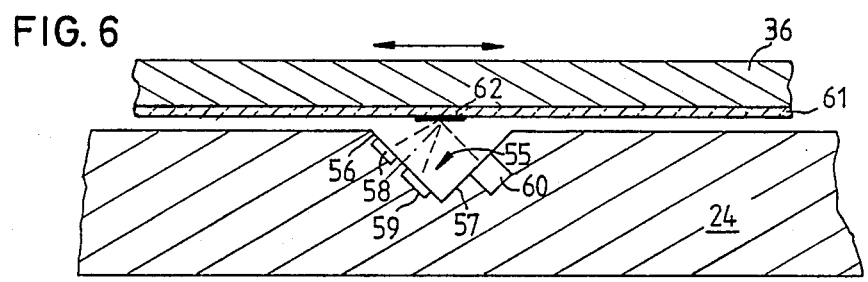
FIG. 6 shows an embodiment of a position indicator used on the coulisse arrangement.

FIG. 6 shows a portion of base plate 24 and slider 36. Machined into the bed of base plate 24 is a beveled recess 55 having its two walls 56 and 57 form a right angle. Embedded in wall 56 are two vacuum-compatible infrared-sensitive photodiodes 58, 59, and embedded in wall 57 is an infrared light-emitting diode 60. Attached to slider 36 is a glass plate 61 which carries a reflector 62 formed, for example, of gold. When reflector 62 passes over recess 55, the radiation emitted by LED 60 will be reflected onto photodiodes 58, 59. The correct position for slider 36 will be reached when both diodes 58 and 59 receive the same amount of reflected radiation. This signal can be used, for example, to balance a bridge circuit (not shown). The bridge circuit may form a part of the controls for motor 33 which control the extension and retraction of coulisse arrangement 21. Several reflectors 62 may be placed on slider 36 to permit the precise positioning thereof at several desired locations. Of course, the position indicator of FIG. 6 may also be used to monitor the relative displacement between sliders 36 and 38.

Figure 7:
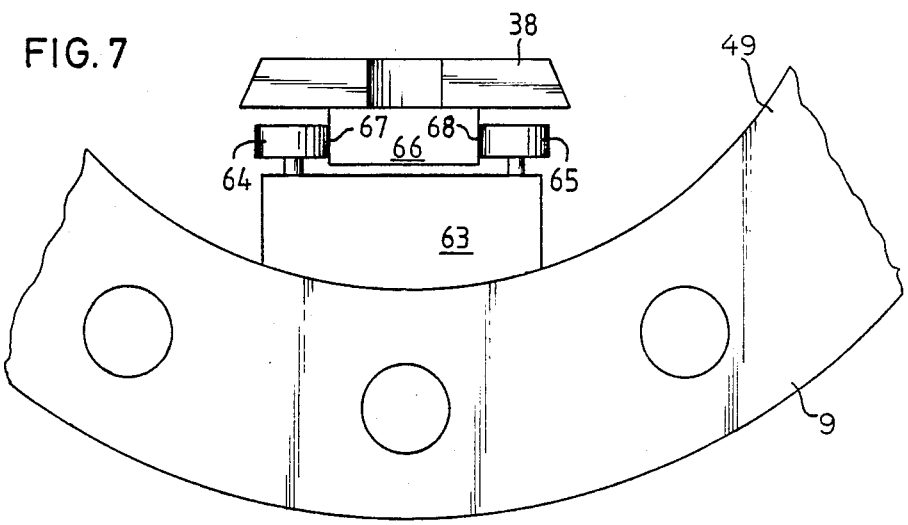
FIG. 7 is a schematic illustration of a guide roller system used to horizontally align the coulisse arrangement when extended.

An alignment problem may be encountered when coulisse arrangement 21 is extended into an adjacent processing chamber as a result of the temperature-induced displacement of that chamber with respect to central processing chamber 1. To alleviate this problem, a system of guide rollers may be used in the vicinity of the flanges of each of the processing chambers 1, 10, 12 and/or at the work stations and at the loading point in airlock 18 of chamber 11. Referring to FIG. 7, one embodiment of a guide roller system includes two guide rollers 64, 65 arranged in one of the openings 49 (typical), with their axes vertically supported in a console 63. A guide bar 66 having rolling surfaces 67, 68 is fixed to slider 38.

The vacuum transfer device in accordance with the present invention is preferably controlled by a control unit performing the following functions: (1) maintenance of the appropriate vacuum conditions including the heating of the entire vacuum transfer device after evacuation; (2) actuation of the slide valves 17 to permit slider 38 to access a selected one of the adjacent processing chambers, and to permit loading an object through the airlock 18; and (3) rotary and linear movement of the coulisse arrangement 21 as required to perform the desired task. Appropriate controls should also be provided for controlling the necessary processing steps to be performed within the additional chambers 10-12.

To prevent accidents during the transfer of an object, the following functions may be provided:

the vacuum on both sides of a slide valve 17 to be opened is checked prior to opening. If the difference is significant, a balancing adjustment is made.

the coulisse arrangement 21 is locked until the slide valve leading to a selected processing chamber is opened.

the rotor of the coulisse arrangement 21 cannot be moved as long as the sliders 36, 38 are not in their home positions.

the slide valves 17 are locked in their open position as long as the coulisse arrangement 21 is extended. All of these control functions and checks can be governed by a computer.

It will be understood by those skilled in the art that all parts used in the transfer device in accordance with the invention must be vacuum-compatible and be able to sustain heating up to about 500° K. for an extended period of time. For example, the photodiodes 58, 59 used in the position indicator may be made vacuum-compatible by removing their protective plastic covers.

While the invention has been described in terms of preferred embodiments thereof, it will be apparent to those skilled in the art that other variations and modifications can be made without departing from the spirit and scope of the present invention.

What is claimed is:

1. A transfer device for transferring objects within a system of evacuatable chambers, comprising:

a central chamber;

a plurality of additional chambers arranged radially around said central chamber;

a table disposed within said central chamber having a rotor means thereon with drive means connected thereto, wherein said rotor means carries a coulisse arrangement for transferring objects positioned thereon from said central chamber to one of said plurality of additional chambers, said coulisse arrangement comprising:

a base plate having a groove therein;

a first member slidably received in said base plate groove, said first member having a groove therein;

a second member slidably received in said groove in said first member;

means for controlling the extension and retraction of said first member and said second member with respect to said base plate; and one or more means for indicating the relative positions of said first and second members and said base plate; and guide roller means positioned in said central chamber at each opening between said central chamber and said additional chambers to align said second member with a selected opening.

2. A transfer device as set forth in claim 1, wherein said extension and retraction controlling means comprises:

a plurality of pulleys affixed to said base plate, said first member and said second member;

a cable drive drum rotatably attached to said base plate; and a cable passing around each pulley of said plurality of pulleys and said cable drive drum, one end of said cable being affixed to said second member and the other end of said cable being affixed to said first member, whereby rotation of said cable drive drum in one direction extends said first member with respect to said base plate and said second member with respect to said first member, and rotation of said cable drive drum in the opposite direction retracts said first member with respect to said base plate and said second member with respect to said first member.

3. A transfer device as set forth in claim 1 or 2, wherein each of said position indicating means comprises:

a groove formed into the surface one of said members facing the surface of an adjacent member, said groove being normal to the axis of said one member and having two surfaces perpendicular to each other and at the same angle to the surface of said one member;

a radiation source affixed to one of said groove surfaces positioned to emit radiation normal thereto;

a pair of radiation detectors affixed to said other groove surface, said pair of radiation detectors being positioned coplanar with said radiation source, one of said detectors being closer to the surface of said one member; and a reflector affixed to the surface of said adjacent member facing said groove, whereby when said reflector passes over said groove the radiation emitted from said radiation source falls on said detectors, a particular relative position of said one and said adjacent members being indicated when both of said radiation detectors receive the same amount of reflected radiation.

* * * * *